US009799721B2

(12) United States Patent
Kuo et al.

(10) Patent No.: US 9,799,721 B2
(45) Date of Patent: Oct. 24, 2017

(54) INTEGRATED MAGNETIC CORE INDUCTOR AND METHODS OF FABRICATIONS THEREOF

(71) Applicant: Taiwan Semiconductor Manufacturing Company, Ltd., Hsin-Chu (TW)

(72) Inventors: Chun-Tsung Kuo, Tainan (TW); Jiech-Fun Lu, Madou Township (TW); Yen-Shuo Su, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/689,494

(22) Filed: Apr. 17, 2015

(65) Prior Publication Data

US 2016/0307991 A1 Oct. 20, 2016

(51) Int. Cl.
| | |
|---|---|
| H01L 27/08 | (2006.01) |
| H01L 49/02 | (2006.01) |
| H01L 23/522 | (2006.01) |
| H01L 23/64 | (2006.01) |
| H01L 27/02 | (2006.01) |
| H01F 41/04 | (2006.01) |
| H01F 17/00 | (2006.01) |
| H01L 23/498 | (2006.01) |

(52) U.S. Cl.
CPC .......... *H01L 28/10* (2013.01); *H01L 23/5227* (2013.01); *H01L 23/645* (2013.01); *H01F 17/0033* (2013.01); *H01F 41/046* (2013.01); *H01L 23/49822* (2013.01); *H01L 27/0288* (2013.01); *H01L 2924/0002* (2013.01); *H01L 2924/1206* (2013.01); *H01L 2924/19042* (2013.01)

(58) Field of Classification Search
CPC ... H01L 28/10; H01L 23/645; H01L 23/5227; H01L 23/49822; H01L 27/0288; H01L 2924/1206; H01L 2924/19042; H01L 2924/0002; H01F 17/0033; H01F 41/046; Y10T 29/49165
See application file for complete search history.

(56) References Cited

U.S. PATENT DOCUMENTS

| | | | |
|---|---|---|---|
| 5,852,866 A * | 12/1998 | Kuettner | H01F 17/0006 29/602.1 |
| 7,250,841 B1 * | 7/2007 | Hopper | H01F 17/0033 336/174 |
| 8,279,008 B2 | 10/2012 | Hsieh et al. | |

(Continued)

*Primary Examiner* — Su C Kim
(74) *Attorney, Agent, or Firm* — Slater Matsil, LLP

(57) ABSTRACT

A method of forming a semiconductor device includes forming a lower coil segment in a first dielectric layer over a substrate, forming a second dielectric layer over the lower coil segment and the first dielectric layer, anisotropically etching a top portion of the second dielectric layer to form an opening over the lower coil segment, depositing magnetic material in the opening to form a magnetic core, forming a third dielectric layer over the magnetic core and the second dielectric layer, forming vias extending through the second dielectric layer and the third dielectric layer, and after forming the vias, forming an upper coil segment over the third dielectric layer and the magnetic core, wherein the vias connect the upper coil segment with the lower coil segment.

20 Claims, 11 Drawing Sheets

(56) References Cited

U.S. PATENT DOCUMENTS

| | | |
|---|---|---|
| 8,427,240 B2 | 4/2013 | Hsieh et al. |
| 8,593,206 B2 | 11/2013 | Chen et al. |
| 8,610,494 B1 | 12/2013 | Jin et al. |
| 8,618,631 B2 | 12/2013 | Jin et al. |
| 2003/0005569 A1* | 1/2003 | Hiatt .................. H01F 17/0006 29/602.1 |
| 2007/0075819 A1* | 4/2007 | Okuzawa ............ H01F 17/0033 336/200 |
| 2009/0042384 A1* | 2/2009 | Miyoshi ............ H01L 21/02063 438/627 |
| 2012/0092230 A1 | 4/2012 | Hung et al. |
| 2013/0127578 A1* | 5/2013 | Kuo ...................... H01F 5/003 336/200 |
| 2013/0234305 A1 | 9/2013 | Lin et al. |
| 2014/0071636 A1 | 3/2014 | Sturcken |
| 2014/0132333 A1 | 5/2014 | Jin et al. |
| 2014/0217546 A1 | 8/2014 | Yen et al. |
| 2014/0253262 A1 | 9/2014 | Hsieh et al. |
| 2014/0253391 A1 | 9/2014 | Yen |

\* cited by examiner

INTEGRATED MAGNETIC CORE INDUCTOR AND METHODS OF FABRICATIONS THEREOF

BACKGROUND

Generally, an inductor is a passive electrical component that can store energy in a magnetic field created by an electric current passing through it. An inductor may be constructed as a coil of conductive material wrapped around a core of dielectric or magnetic material. One parameter of an inductor that may be measured is the inductor's ability to store magnetic energy, also known as the inductor's inductance. Another parameter that may be measured is the inductor's Quality (Q) factor. The Q factor of an inductor is a measure of the inductor's efficiency and may be calculated as the ratio of the inductor's inductive reactance to the inductor's resistance at a given frequency.

Inductors may be utilized in a wide variety of applications. One such application of an inductor may be as a choke, in which an inductor is designed to have a high inductive reactance to, or block, signals with certain frequencies in an electrical circuit while allowing passage of other signals at different frequencies in the electrical circuit. A choke may be made, for example to block a radio frequency (RF), and may be called a RF choke, which is of use in radio communications. Another application of an inductor may be as a voltage regulator, in which an inductor is used in a voltage control circuit to reduce sudden changes in the power supply, thus providing a smooth voltage supply to electrical systems for improved system performance.

Traditionally, inductors are used as discrete components which are placed on a substrate such as a printed circuit board (PCB) and connected to other parts of the system, such as an integrated circuit (IC) chip, via contact pads and conductive traces. Discrete inductors are bulky, require larger footprints on the PCB, and consume lots of power. Due to the continued miniaturization of electric devices, it is desirable to integrate inductors into IC chips. Therefore, there is a need for manufacturing integrated inductors that provide the benefit of size, cost and power reduction without sacrificing the electrical performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
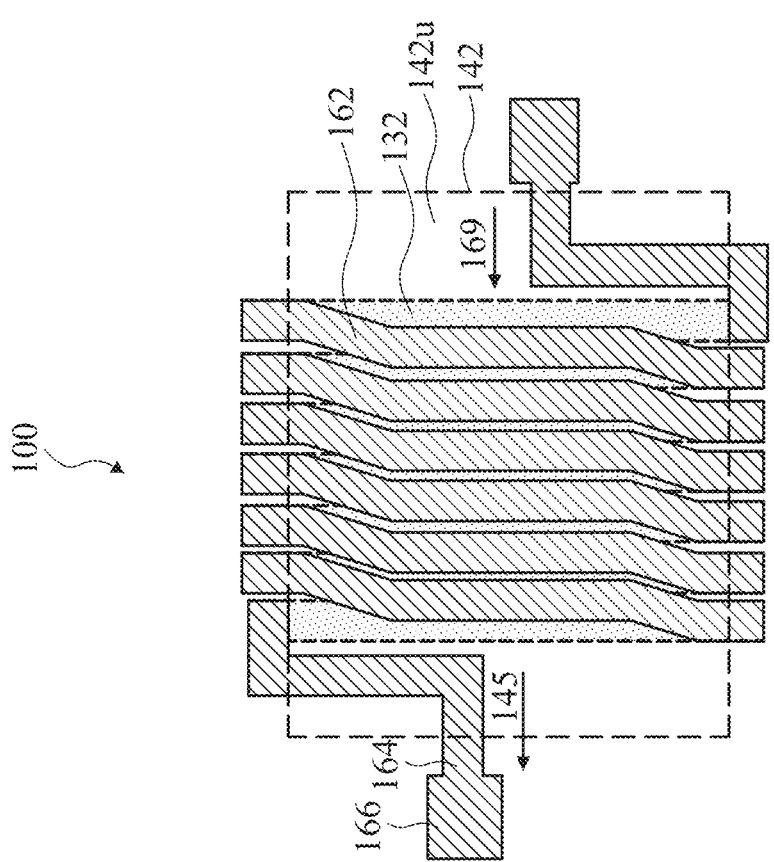
FIG. 1A illustrates a top view of an integrated inductor of a semiconductor device, according to one or more aspects of the present disclosure.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

The embodiments will be described with respect to embodiments in a specific context, namely an integrated inductor with a magnetic core. The embodiments may also be applied, however, to other inductors.

Illustrated in FIG. 1A is a top view of an integrated inductor of a semiconductor device 100, formed in passivation layers during the Back-End-Of-Line (BEOL) processing of semiconductor manufacturing process, in accordance with some embodiments. As shown in FIG. 1A, an integrated inductor comprises a plurality of coils or windings that are concatenated and formed around a magnetic core 142 (shown in phantom). The magnetic core 142 has a planar upper surface 142U and a planar lower surface 142L (not shown in FIG. 1A, see FIG. 1B). The planar surfaces 142U and 142L are parallel to substrate 101 (see FIG. 1B), in some embodiments. A center axis 145 of magnetic core 142 along a longitudinal direction of magnetic core 142 substantially overlaps with a center axis 169 of the plurality of coils, in some embodiments. Each of the plurality of coils may comprise an upper portion 162 (hereafter upper coil segment 162) and a lower portion 132 (hereafter lower coil segment 132, shown in phantom). In some embodiments, the lower coil segment 132 is formed in a dielectric layer below the magnetic core 142, and the upper coil segment 162 is formed in another dielectric layer above the magnetic core 142, and vias 152 connect the upper coil segment 162 with the lower coil segment 132 (see FIG. 1B).

As illustrated in FIG. 1A, the integrated inductor, which includes lower coil segments 132, vias 152 (see FIG. 1B), upper coil segments 162 and magnetic core 142, may connect to conductive traces 164 and conductive pads 166, which may further connect to other conductive features of semiconductor device 100 to perform specific functions of the design. Although not shown in FIG. 1A, the integrated inductor may be connected through, e.g., vias to other conductive features formed in various layers of semiconductor device 100, in some embodiments.

Figure 1B:
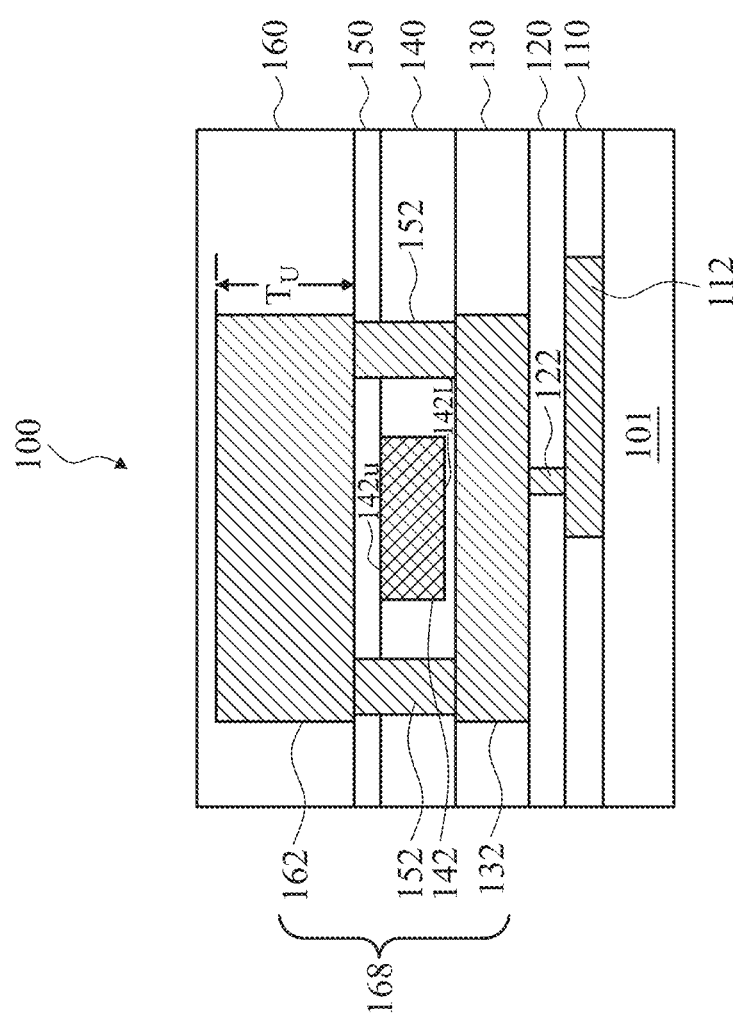
FIG. 1B illustrates a cross-sectional view of a semiconductor device comprising an integrated inductor, according to one or more aspects of the present disclosure.

FIG. 1B illustrates a cross-sectional view of semiconductor device 100 along a plane perpendicular to center axis 169 of the plurality of coils in FIG. 1A. The integrated inductor 168, which includes lower coil segments 132, vias 152, upper coil segments 162 and magnetic core 142, is formed in a plurality of dielectric layers over semiconductor substrate 101. Note that depending on the specific design for the upper coil segments 162 and lower coil segments 132, upper coil segments 162 or lower coil segments 132 may not be visible in a cross-sectional view, in some embodiments. In other embodiments, at least a portion of the upper coil segment 162 or/and at least a portion of the lower coil segment 132 may not be visible in a cross-sectional view. To simplify illustration, both upper coils segments 162 and lower coil segments 132 are shown as visible in all cross-sectional views in the present disclosure without intent to limit. One of ordinary skill in the art will appreciate that the embodiments illustrated in the present disclosure can be easily applied to various designs for upper coils segments 162 and lower coil segments 132 without departing from the spirit and scope of the present disclosure.

The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The semiconductor substrate 101 may include active devices (not shown in FIG. 1B for clarity). As one of ordinary skill in the art will recognize, a wide variety of active devices such as transistors, capacitors, resistors, combinations of these, and the like may be used to generate the desired structural and functional requirements of the design for the semiconductor device 100. The active devices may be formed using any suitable methods.

The semiconductor substrate 101 may also include metallization layers (also not shown in FIG. 1B for clarity). The metallization layers may be formed over the active devices and are designed to connect the various active devices to form functional circuitry. The metallization layers (not shown) may be formed of alternating layers of dielectric (e.g., low-k dielectric material) and conductive material (e.g., copper) and may be formed through any suitable process (such as deposition, damascene, dual damascene, etc.).

As illustrated in FIG. 1B, six passivation layers (e.g., the first passivation layer 110, the second passivation layer 120, the third passivation layer 130, the fourth passivation layer 140, the fifth passivation layer 150 and the sixth passivation layer 160) are formed consecutively over the substrate 101, in some embodiments. The first passivation layer 110 may be disposed over substrate 101, and post-passivation interconnect (PPI) 112 may be formed in first passivation layer 110. The PPI may be connected to metal layers in substrate 101 or other layers of semiconductor device 100 by vias (not shown), in some embodiments. The PPI may be connected to lower coil segments 132 formed in the third passivation layer 130 by vias 122, which are formed in the second passivation layer 120, in some embodiments. Magnetic core 142 is formed in the fourth passivation layer 140 and is surrounded by and insulated from lower coil segments 132, upper coil segments 162, and vias 152. Magnetic core 142 fills up opening 145 (see FIG. 6) in the fourth passivation layer 140 and has a rectangular cross-section. A lower surface 142L of magnetic core 142 overlies an upper surface of lower coil segments 132 by a small offset, and an upper surface 142U of magnetic core 142 is coplanar with an upper surface of the fourth passivation layer 140. A fifth passivation layer 150 is formed over the fourth passivation layer 140 and the magnetic core 142. Upper coil segments 162 are formed in a sixth passivation layer 160. Vias 152 extends through both fifth passivation layer 150 and fourth passivation layer 140 to connect upper coil segments 162 with lower coil segments 132.

The embodiment in FIG. 1B shows six passivation layers, however, one of ordinary skill in the art will appreciate that more or less than six passivation layers may be formed without departing from the spirit and scope of the present disclosure. For example, there may be one or more passivation layers over the upper coil segments 162, and there could be more or less passivation layers under lower coil segment 132 than those illustrated in FIG. 1B. In addition, other features such as contact pads, conductive traces, and external connectors may be formed in/on semiconductor device 100, but are not shown in FIG. 1B for clarity.

FIG. 2-9 illustrates cross-sectional views of semiconductor device 100 at various stages of fabrication according to embodiments of the present disclosure.

Figure 2:
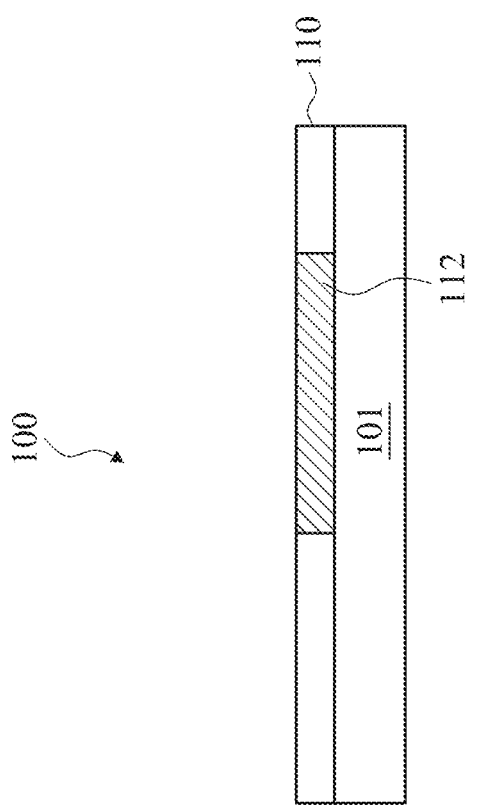
FIGS. 2-8 illustrate various cross-sectional views of a semiconductor device at various stages of fabrication according to embodiments of the present disclosure.

As illustrated in FIG. 2, the first passivation layer 110 may be formed on the semiconductor substrate 101. The first passivation layer 112 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The first passivation layer 112 may be formed through a process such as chemical vapor deposition (CVD), although any suitable process may be utilized. The first passivation layer 112 may have a thickness between about 0.5 µm and about 5 µm, however, other ranges of thickness are also possible, depending on the designs and requirements of semiconductor device 100.

The post-passivation interconnect (PPI) 112 may be formed over the semiconductor substrate 101 and within the first passivation layer 110 to provide an electrical connection between the integrated inductor 168 and other circuits of semiconductor device 100, in some embodiments. For example, the PPI 112 may be connected to metal layers in substrate 101 (not shown). The PPI 112 may comprise copper, but other materials, such as aluminum, may alternatively be used. An opening through the first passivation layer 112 may be made in the desired location of PPI 112 through a suitable process, such as a suitable photolithographic masking and etching. For example, a photoresist (not shown) may be formed on the first passivation layer 110 and may then be patterned in order to provide an opening in the first passivation layer 110. The patterning may be performed by exposing the photoresist to a radiation such as light in order to activate photoactive chemicals that may make up one component of the photoresist. A positive developer or a negative developer may then be used to remove either the exposed or unexposed photoresist depending on whether positive or negative photoresist is used.

Once the photoresist has been developed and patterned, PPI 112 may be constructed by using the photoresist as a mask to form the opening into or through the first passivation layer 110 using, e.g., an etching process. The conductive material may then be formed into the opening into or through the first passivation layer 110, e.g., by first applying a seed layer (not shown) into and along the sidewalls of the opening. The seed layer may then be utilized in an electroplating process in order to plate the conductive material into the opening into or through the first passivation layer 110, thereby forming the first interconnect 112. However, while the material and methods discussed are suitable to form the conductive material, these materials are merely exemplary. Any other suitable materials, such as tungsten, and any other suitable processes of formation, such as CVD or physical vapor deposition (PVD), may alternatively be used to form the PPI 112.

Figure 3:
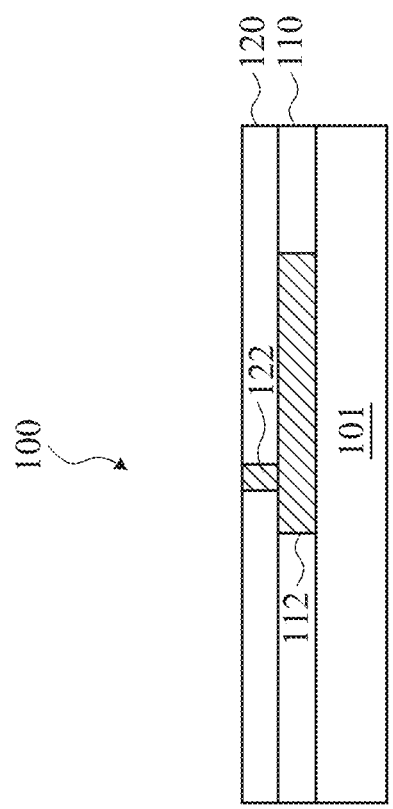

A second passivation layer 120 may be formed over the first passivation layer 110, as illustrated in FIG. 3. In some embodiments, the second passivation layer 120 may comprise silicon nitride, silicon oxide, silicon oxynitride, silicon carbide, and combinations thereof. In some embodiments, the second passivation layer 120 may comprise the same dielectric material as the first passivation layer 110. Alternatively, the second passivation layer 120 may comprise other suitable dielectric materials different from the dielectric materials in the first passivation layer 110. Deposition process such as CVD, PVD, combinations thereof, or any other suitable processes of formation, can be used to form second passivation layer 120.

Vias 122 may be formed in second passivation layer 120 to provide a conductive path between PPI 112 in the first passivation layer 110 and integrated inductor 168 formed in subsequent processing. Vias 122 may comprise copper, but other materials, such as aluminum or tungsten, may alternatively be used. Vias 122 may be formed, e.g., by forming openings for the vias 122 through the second passivation layer 120 using, e.g., a suitable photolithographic mask and etching process. After the openings for vias 122 have been formed, vias 112 may be formed using a seed layer (not shown) and a plating process, such as electrochemical plating, although other processes of formation, such as sputtering, evaporation, or plasma-enhanced CVD (PECVD) process, may alternatively be used depending upon the desired materials. Once the openings for vias 112 have been filled with conductive material, any excess conductive material outside of the openings for vias 112 may be removed, and vias 112 and the second passivation layer 120 may be planarized using, for example, a chemical mechanical polishing (CMP) process.

Figure 4:
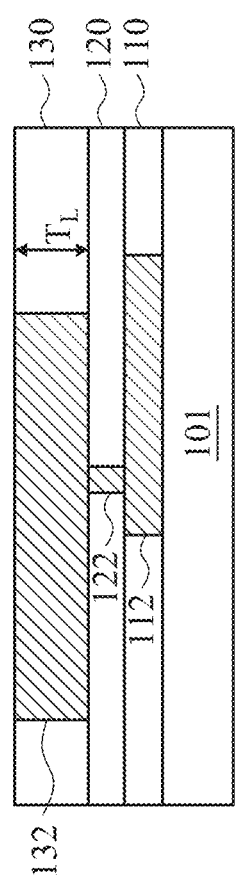

As illustrated in FIG. 4, a third passivation layer 130 may be formed over the second passivation layer 120. The third passivation layer 130 may comprise silicon nitride, silicon oxide, silicon oxynitride, silicon carbide, and combinations thereof and may be formed by CVD, PVD, or any other suitable processes of formation, in some embodiments. After forming the third passivation layer 130, lower coil segments 132 are formed in the third passivation layer 130. In accordance with some embodiments, the lower coil segments 132 comprise copper and may be formed by, e.g., a suitable photolithographic mask and etching process to form openings in the third passivation layer 130, then filing the openings for lower coil segments 132 with copper by, e.g., a electrochemical plating process, a PVD process, a CVD process, combinations thereof, or any other suitable process. In one embodiment, the lower coil segments 132 have a thickness $T_L$ in a range between about 5 um and about 10 um, such as about 6 um. The above thickness range is merely an example, the dimensions of the integrated inductor 168 (e.g., lower coil segments 132, upper coil segments 162, vias 152 and magnetic core 142) are determined by various factors such as the functional requirements for the integrated inductor 168 and process technologies (e.g., 90 nm/45 nm/28 nm process node), thus other dimensions for the integrated inductor 168 are possible and are fully intended to be included within the scope of the current disclosure.

Figure 5:
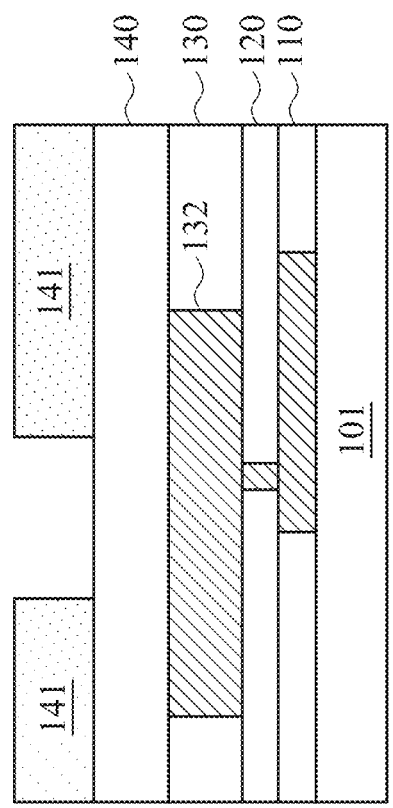

After the third passivation layer 130 is formed, a fourth passivation layer 140 is formed over the third passivation layer, as illustrated in FIG. 5. In one embodiment, the fourth passivation layer 140 comprises silicon nitride, silicon oxide, silicon oxynitride, silicon carbide, or combinations thereof, and has a thickness in a range from about 5 um to about 6 um, although other suitable dielectric materials and thickness ranges are also possible. Deposition methods, such as CVD, PVD, PECVD, sputtering, combinations thereof, or any other suitable methods could be used to form the fourth passivation layer 140.

In accordance with various embodiments, a photoresist (PR) layer 141 is formed over the fourth passivation layer 140 and patterned by a lithography process. The PR material 141 is exposed to light or energy reflected from or transmitted through a lithography mask (not shown) that has the desired pattern thereon. The PR material 141 is then developed, and exposed or unexposed portions of the PR material 141 are removed depending on the whether positive or negative type of photoresist is used. The remaining PR material is cured to form masks for a subsequent etching process. As illustrated in FIG. 5, after patterning the PR layer 141, an opening 145 is formed in the PR layer 141 above the location where the magnetic core 142 will be formed in subsequent processing, in some embodiments.

Figure 6:
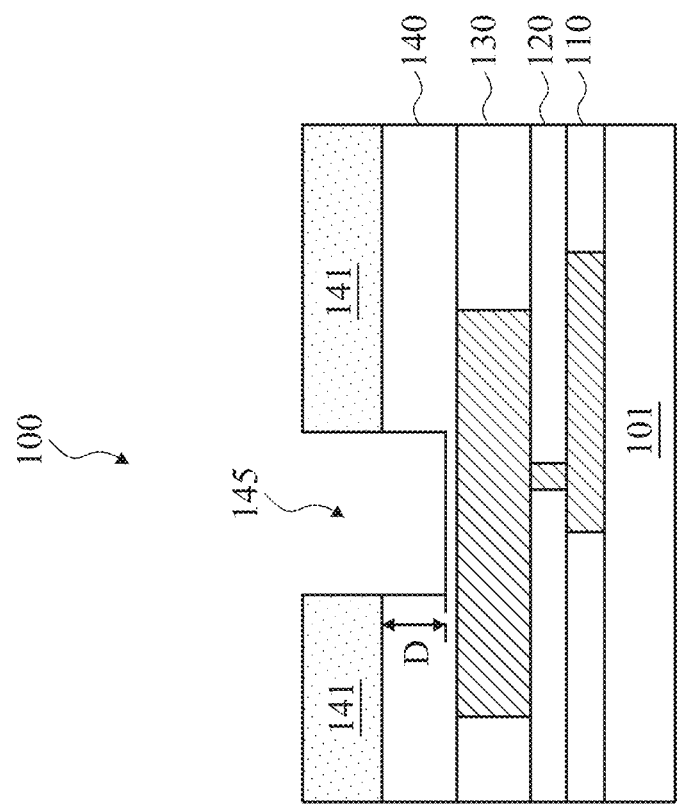

Referring next to FIG. 6, an anisotropic etching process is performed to remove a top portion of the fourth passivation layer 140 exposed by the opening 145, in some embodiments. As a result of the etching process, opening 145 now extends into the fourth passivation layer 140. The etching process is controlled to stop before reaching lower coil segments 132 such that a thin layer of fourth passivation layer 140 remains at the bottom of opening 145. In some embodiments, the etching process is controlled by a time-based method determined by the material composition and etch rate of the fourth passivation layer 140, although other suitable methods for controlling the etching process can also be used. As an example, consider a fourth passivation layer 140 comprising SiN with a thickness of 52000 Å and an etch rate of 5000 Å per minute, an etch time of 10 minutes can be used to remove top portions of the fourth passivation layer 140 and leave 2000 Å of SiN at the bottom of opening 145. In an embodiment, the opening 145 formed within the fourth passivation layer 140 has a depth D of about 5 um, and the thin layer of fourth passivation layer 140 remaining at the bottom of the opening 145 has a depth of about less than 1 um, although other dimensions are possible and may be determined by the functional requirement of the integrated inductor and process technologies.

Due to the anisotropic etching process, the opening 145 has straight sidewalls, and the portion of opening 145 within the fourth passivation layer 140 has a rectangular cross-section. After the anisotropic etching process, the remaining PR is removed, e.g., by an ashing process.

In some embodiments, the anisotropic etching process is performed via a plasma etch at a pressure in a range from about 5 mTorr to about 10 mTorr, at a power in a range from about 300 watts to about 600 watts, with an etching bias in a range from about 100 volts to about 200 volts, at a temperature in a range from about 50° C. to about 70° C., with a plasma flow including from about 200 standard cubic centimeters per minute (sccm) to about 300 sccm of $H_e$ and about 10 sccm to about 30 sccm of $CH_2F_2$, and with a duration of about 300 to about 500 seconds.

Figure 7A:
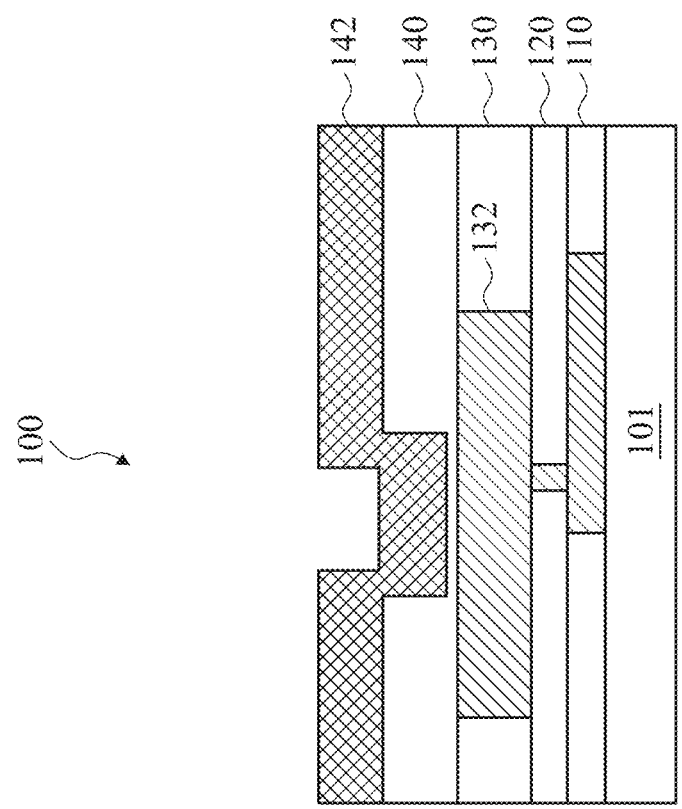

Next, as illustrated in FIG. 7A, magnetic material 142 is deposited in openings 145 (see FIG. 6) by a PVD, CVD, PE-CVD, combinations thereof, or any other suitable deposition process. In accordance with an embodiment, without intent of limiting, magnetic material 142 is conformally deposited over the fourth passivation layer 140 and opening 145 such that magnetic material 142 fills opening 145 and covers the upper surface of the fourth passivation layer 140.

Figure 7B:
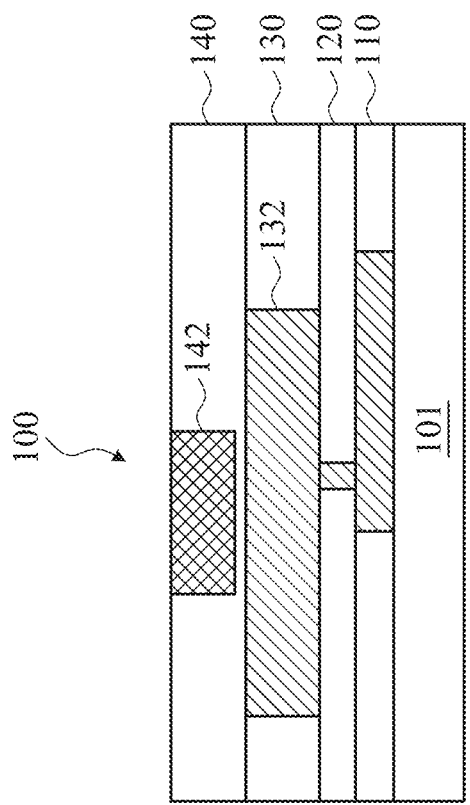

As illustrated in FIG. 7B, after openings 145 has been filled with magnetic material 142, any excess magnetic material outside openings 145 may be removed by, e.g., a CMP process. The remaining magnetic material 142 inside opening 145 forms magnetic core 142. Due to the planarization process used to remove excess magnetic material (e.g., the CMP process), magnetic core 142 has a planar upper surface level with the upper surface of fourth passivation layer 140, in some embodiments. The process illustrated in FIGS. 6, 7A and 7B ensures that the shape or profile of magnetic core 142 is mostly determined by opening 145. Since the profile of opening 145 can be easily controlled by, e.g., a dry etch process, the present disclosure provides an easy way to obtain a desirable profile for magnetic core 142 by controlling the profile of opening 145. As shown in FIG. 7B, magnetic core 142 formed by filling opening 145 with magnetic material has a rectangular cross-section, in some embodiments.

Figure 7C:
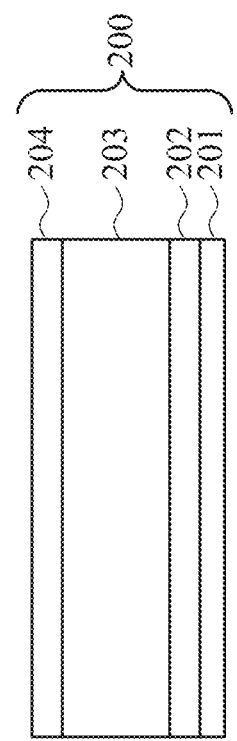

In accordance with some embodiments, magnetic material 142 comprises $Co_xZr_yTa_z$ (CZT), where x, y, and z represents the atomic percentage of cobalt (Co), zirconium (Zr), and tantalum (Ta), respectively. In some embodiments, x is in a range from about 0.85 to about 0.95, y is in a range from about 0.025 to about 0.075, and z is in a range from about 0.025 to about 0.075. In an embodiment, x=0.915, y=0.04, and z=0.045 for the CZT material. In accordance with some embodiments, magnetic core 142 has a thickness of about 5 um and has a laminated structure that comprises a plurality of film structures stacked together. In some embodiments, magnetic core 142 may be formed by repeating a deposition process multiple times or cycles, where each cycle of deposition process forms a film structure 200 such as the one illustrated in FIG. 7C. In some embodiments, a first deposition cycle forms a first film structure in opening 145, and each additional deposition cycle forms a new film structure over an earlier formed film structure. As illustrated in FIG. 7C, film structure 200 may comprise layers 204, 203, and 202 consecutively formed on layer 201. For example, layer 201 may comprise Ta and have a thickness of about 50 Å, layer 202 may comprise an oxide of CZT and have a thickness of about 150 Å, layer 203 may comprises CZT and have a thickness of about 2000 Å, and layer 204 may comprise Ta and have a thickness of about 50 Å. Film structure 200 may be formed by consecutively depositing layers 201, 202, 203 and 204 using, e.g., CVD deposition processes. In some embodiments, up to about 22 cycles of the deposition process are performed to form up to 22 film structures 200 stacked together in opening 145.

In the example above, Ta is used in film structure 200 for its good temperature stability, which helps to prolong device lifetime. Ta also acts as a barrier to prevent oxygen diffusion into CZT, thus preventing magnetic property loss of the magnetic core 142. One skilled in the art will appreciate that other materials having similar desirable properties as Ta may alternatively be used in film structure 200. The oxide of CZT in film structure 200 prevents electrical current circulation in magnetic core 142 perpendicular to the upper surface of magnetic core 142, which electrical current is known in the art as Eddy currents. Since Eddy currents lead to energy losses for an inductor, it is advantageous to reduce Eddy currents by having a dielectric layer in film structure 200. One skilled in the art will appreciate that other suitable dielectric layer, such as $SiO_2$, or CoO, maybe also be used in film structure 200 to reduce Eddy currents.

Figure 8:
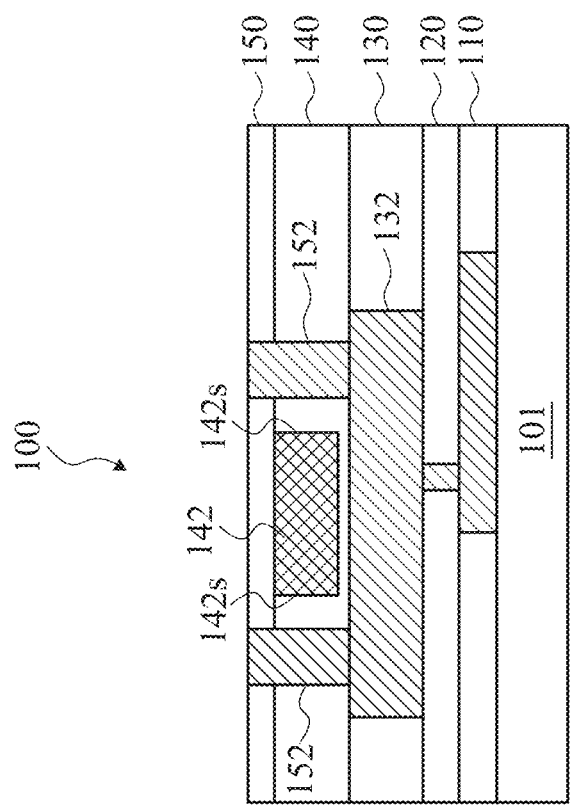

Next, as illustrated in FIG. 8, a fifth passivation layer 150 is formed over the planar upper surface of magnetic core 142 and the fourth passivation layer 140 using suitable methods known in the art, such as PVD, CVD. The fifth passivation layer may be made of polymers, such as polybenzoxazole (PBO), polyimide, or benzocyclobutene, in some embodiments, or silicon dioxide, silicon nitride, silicon oxynitride, tantalum pentoxide, or aluminum oxide, in some other embodiments. In accordance with an embodiment, the fifth passivation layer 150 may have a thickness in a range from about 1 nm to about 1.5 nm, such as about 1 nm.

After the fifth passivation layer 150 is formed, vias 152 may be formed, e.g., by forming openings for the vias 152 through the fourth passivation layer 140 and fifth passivation layer 150 using, e.g., a lithography and etching process. The vias 152 may be formed adjacent to and along opposing sidewalls 142s of magnetic core 142. After the openings for vias 152 have been formed, vias 152 may be formed using a seed layer (not shown) and a plating process, such as electrochemical plating, although other processes of formation, such as sputtering, evaporation, or PECVD process, may alternatively be used depending upon the desired materials. Once the openings for vias 152 have been filled with conductive material such as copper, any excess conductive material outside of the openings for vias 152 may be removed, and vias 152 and the fifth passivation layer 150 may be planarized using, for example, a CMP process.

Next, referring to FIG. 1B, upper coil segments 162 are formed over the fifth passivation layer 150. In some embodiments, upper coil segments 162 are made of copper and may be formed by, e.g., depositing a PR layer (not shown) over the fifth passivation layer 150, patterning the PR by lithography and etching process to form openings in the PR, then filing the openings for upper coil segments 162 with copper by, e.g., a electrochemical plating process, a PVD process, a CVD process, combinations thereof, or any other suitable process. In some embodiments, a seed layer (not shown) may be formed in the openings for upper coil segments before filling the openings for upper coil segments with copper. In one embodiment, the upper coil segments 162 have a thickness $T_U$ in a range between about 10 um and about 15 um, such as about 12 um. Other dimensions are possible and may depend on, for example, the functional requirements for the integrated inductors 168 and process technologies. After upper coil segments 162 are formed, the remaining PR may be removed by, e.g., an ashing process.

Next, a sixth passivation layer 160 (see FIG. 1B) may be formed over the fifth passivation layer 150 and upper coil segments 162. The sixth passivation layer 160 may comprises polybenzoxazole (PBO), polyimide, or benzocyclobutene, in some embodiments, or silicon dioxide, silicon nitride, silicon oxynitride, tantalum pentoxide, or aluminum oxide, in some other embodiments. Deposition processes such as PVD, CVD, or other suitable process, maybe used to form the sixth passivation layer 160. The thickness of the sixth passivation layer 160 may be larger than the thickness of the upper coil segments 162 so that upper coil segments 162 is encapsulated in the sixth passivation layer 160 and protected from outside environment. Alternatively, the sixth passivation layer 160 may have a thickness substantially the same as the thickness of upper coil segments 162, and upper coil segment 162 may be formed after the sixth passivation layer 160 is formed using a similar method for forming lower coil segments 132. Although not shown in FIG. 1B, one or more passivation layers may be formed over the sixth passivation layer 160.

Embodiments of the above described processes for forming an integrated inductor have many advantages. For example, the above described processes avoid problems such as magnetic core volume loss and lateral etch problem.

By using plasma etch process to form openings (e.g., openings 145 in the fourth passivation layer 140) and depositing magnetic material in the opening, the magnetic core formed can easily maintain desired volume and a rectangular cross-section, both are important for good inductor performance. Compared with existing processes, the above described processes do not need any extra lithography mask, thus performance improvement is achieved without the additional cost of extra mask. Integrated inductors fabricated using the above described processes provide performance improvements over discrete inductors in areas such as size, cost, and power consumption, and could be integrated with power management integrated circuits (PMIC) to reduce the form factor of electric devices such as mobile phone. As another example, integrated voltage regulars (IVR) comprising integrated inductors could be made with a very small form factor, which enables the use of multiple IVRs in a system to optimize the voltages for different sub-systems. For example, in a multi-core CPU system, multiple IVRs could be used so that each CPU core has its own IVR to optimize the voltage of each CPU core for power saving. In addition, due to the shorter distance to the load, IVRs can provide faster control time than voltage regulars with external discrete inductors, which could result in better system performance and reduced power consumption.

Figure 9:
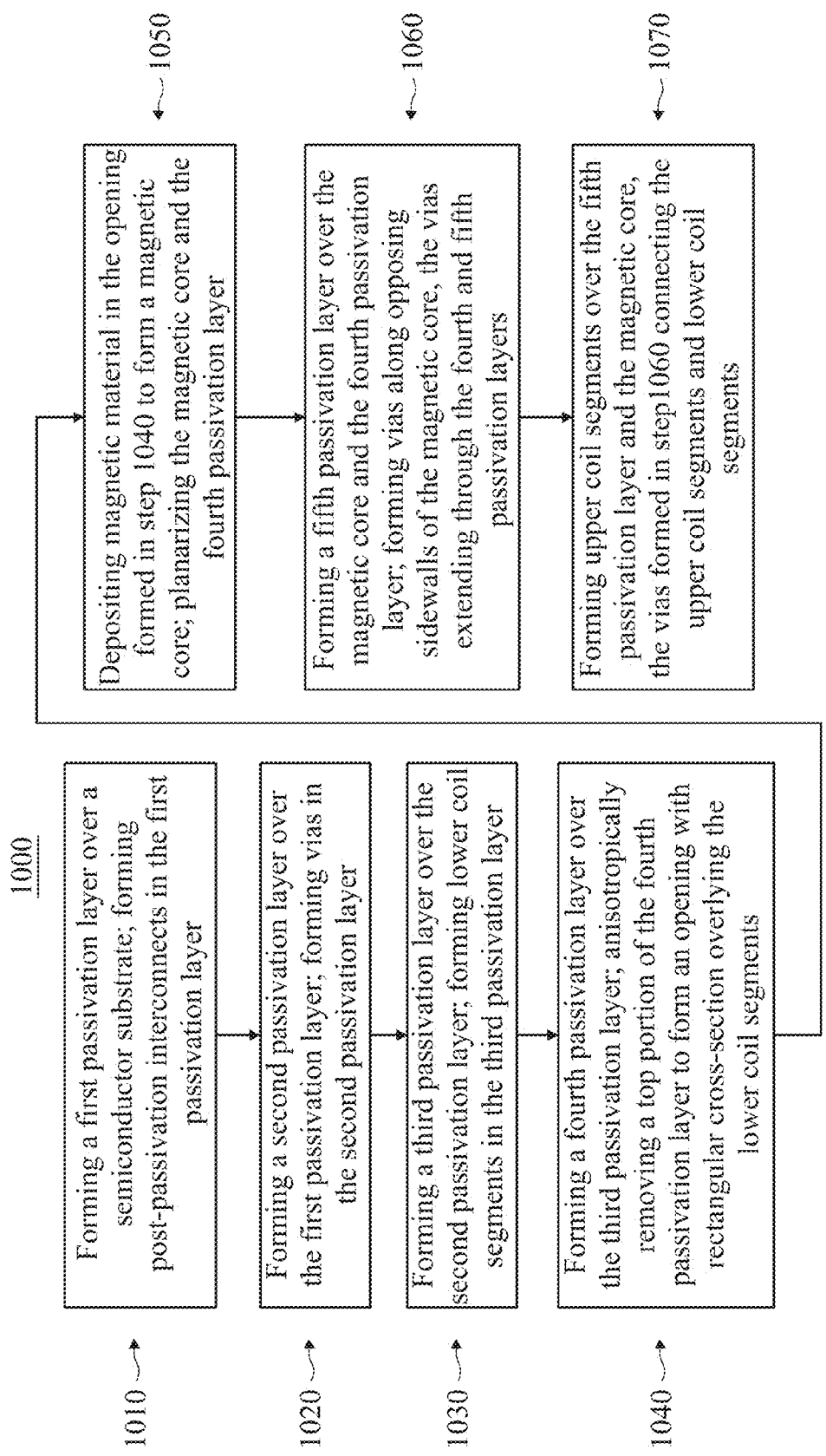
FIG. 9 illustrates a flowchart illustrating a method for fabricating a semiconductor device according to various aspects of the present disclosure.

FIG. 9 illustrates a flow chart of a method for forming semiconductor device 100 shown in FIG. 1B, in accordance with various embodiments of the present disclosure. The flowchart shown in FIG. 9 is merely an example, which should not unduly limit the scope of the claims. One of ordinary skill in the art would recognize many variations, alternatives, and modifications. For example, various steps as illustrated in FIG. 9 may be added, removed, replaced, rearranged and repeated.

Referring to FIG. 9. At step 1010, a first passivation layer is formed over a semiconductor substrate, and post-passivation interconnects are formed in the first passivation layer. At step 1020, a second passivation layer is formed over the first passivation layer, and vias are formed in the second passivation layer. At step 1030, a third passivation layer is formed over the second passivation layer, and lower coil segments are formed in the third passivation layer. At step 1040, a fourth passivation layer is formed over the third passivation layer, a top portion of the fourth passivation layer is removed by an anisotropic etching processing to form an opening with rectangular cross-section in the fourth passivation layer overlying the lower coil segments. At step 1050, magnetic core material is deposited in the opening formed in step 1040 to form a magnetic core, and the magnetic core and the fourth passivation layer are planarized. At step 1060, a fifth passivation layer is formed over the magnetic core and the fourth passivation layer, vias are formed along opposing sidewalls of the magnetic core, and the vias extend through the fourth and fifth passivation layers. At step 1070, upper coil segments are formed over the fifth passivation layer and the magnetic core, the vias formed in step 1060 connect the upper and lower coil segments.

In accordance with an embodiment, a method of forming a semiconductor device includes forming a lower coil segment in a first dielectric layer over a substrate, forming a second dielectric layer over the lower coil segment and the first dielectric layer, anisotropically etching a top portion of the second dielectric layer to form an opening over the lower coil segment, depositing magnetic material in the opening to form a magnetic core, forming a third dielectric layer over the magnetic core and the second dielectric layer, forming vias extending through the second dielectric layer and the third dielectric layer, and after forming the vias, forming an upper coil segment over the third dielectric layer and the magnetic core, wherein the vias connect the upper coil segment with the lower coil segment.

Another embodiment is a method of forming an integrated inductor in a semiconductor device, the method includes forming a lower coil segment in a first passivation layer disposed over a substrate, creating an opening in a second passivation layer disposed over the first passivation layer, wherein the opening overlies the lower coil segment and has straight sidewalls and a flat bottom surface, filling the opening with magnetic material to form a magnetic core, forming an upper coil segment over the magnetic core and forming vias connecting the upper coil segment and the lower coil segment.

In another embodiment, a semiconductor devices includes a first dielectric layer over a substrate, a lower coil segment in the first dielectric layer, an upper coil segment over the lower coil segment, a magnetic core disposed between and insulated from the lower coil segment and the upper coil segment, wherein the magnetic core has a rectangular cross-section and is formed in a second dielectric layer disposed over the first dielectric layer and under the upper coil segment, wherein an upper surface of the magnetic core is coplanar with an upper surface of the second dielectric layer, and wherein the magnetic core has a thickness smaller than a thickness of the second dielectric layer, a third dielectric layer disposed over the magnetic core and the second dielectric layer and below the upper coil segment, and a plurality of vias disposed along opposing sidewalls of the magnetic core, wherein the vias extend through the second dielectric layer and the third dielectric layer to connect the upper coil segment with the lower coil segment.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a semiconductor device, comprising:
    forming a lower coil segment in a first dielectric layer over a substrate;
    forming a second dielectric layer over the lower coil segment and the first dielectric layer;
    anisotropically etching a top portion of the second dielectric layer to form an opening over the lower coil segment;
    depositing magnetic material in the opening to form a magnetic core, comprising:
        repeatedly depositing a film structure in the opening to form a laminated structure for the magnetic core, wherein the film structure is formed by depositing a first layer made of a first metal, a second layer over the first layer made of an oxide of a second metal, a third layer over the second layer made of the second metal, and a fourth layer over the third layer made of the first metal;
    forming a third dielectric layer over the magnetic core and the second dielectric layer;
    forming vias extending through the second dielectric layer and the third dielectric layer; and after forming the vias, forming an upper coil segment over the third dielectric layer and the magnetic core, wherein the vias connect the upper coil segment with the lower coil segment.

2. The method of claim 1, wherein the anisotropically etching a top portion of the second dielectric layer stops before reaching the lower coil segment and creates an opening with a substantially rectangular cross-section.

3. The method of claim 2, wherein the anisotropically etching a top portion of the second dielectric layer is performed by a plasma etch process.

4. The method of claim 1, wherein the second dielectric layer is formed using a material selected from the group consisting essentially of silicon nitride, silicon oxide, silicon oxynitride, silicon carbide, and combinations thereof.

5. The method of claim 1, wherein the first layer of the film structure has a thickness of about 50 Å, the second layer of the film structure has a thickness of about 150 Å, the third layer of the film structure has a thickness of about 2000 Å, and the fourth layer of the film structure has a thickness of about 50 Å.

6. The method of claim 1, further comprising after the depositing magnetic material in the opening, removing excess magnetic material outside the opening by a planarization process.

7. The method of claim 1, wherein the third dielectric layer is formed using a material selected from the group consisting essentially of polybenzoxazole (PBO), polyimide, benzocyclobutene, and combinations thereof.

8. The method of claim 1, wherein the vias are formed adjacent to and along opposing sidewalls of the magnetic core.

9. The method of claim 1, further comprising forming at least one dielectric layer over the upper coil segment.

10. A method of forming an integrated inductor in a semiconductor device, comprising:
    forming a lower coil segment in a first passivation layer disposed over a substrate;
    creating an opening in a second passivation layer disposed over the first passivation layer, wherein the second passivation layer extends continuously without an interface from a first side of the second passivation layer contacting the first passivation layer to a second side of the second passivation layer opposing the first side, wherein the opening overlies the lower coil segment and has straight sidewalls and a flat bottom surface, with the flat bottom surface disposed between the first side and the second side of the second passivation layer, and wherein the flat bottom surface of the opening, the first side of the second passivation layer, and the second side of the second passivation layer are parallel to a major surface of the substrate;
    filling the opening with magnetic material to form a magnetic core, wherein the filling the opening comprises successively forming a plurality of film structures in the opening, wherein each of the plurality of film structures comprise a first film comprising a first metal, a second film comprising the first metal, a third film comprising a second metal, and a fourth film comprising an oxide of the second metal, and wherein the third film and the fourth film are between the first film and the second film;
    forming an upper coil segment over the magnetic core; and
    forming vias connecting the upper coil segment and the lower coil segment.

11. The method of claim 10, wherein the opening is created by an anisotropic plasma etch process, wherein the anisotropic plasma etch process removes a top portion of the second passivation layer without exposing the lower coil segment in the first passivation layer.

12. The method of claim 10, wherein the filling the opening with magnetic material is performed by repeating a deposition process multiple cycles, wherein a first deposition cycle forms a first film structure in the opening, wherein each additional deposition cycle forms a new film structure over an earlier formed film structure in the opening.

13. The method of claim 12, wherein the deposition process is repeated about 22 cycles, and wherein the film structure formed in each deposition cycle comprise a layer of Ta with a thickness of about 50 Å, a layer of CoZrTa with a thickness of about 2000 Å, a layer of an oxide of CoZrTa with a thickness of about 150 Å, and another layer of Ta with a thickness of about 50 Å.

14. The method of claim 10, further comprising forming a third passivation layer over the magnetic core and the second passivation layer, before forming the upper coil segment.

15. The method of claim 14, wherein the forming vias connecting the upper coil segment and lower coil segment is performed before the forming an upper coil segment, and wherein the vias are formed in the third passivation layer and the second passivation layer along opposing sidewalls of the magnetic core.

16. A semiconductor device, comprising:
    a first dielectric layer over a substrate;
    a lower coil segment in the first dielectric layer;
    an upper coil segment over the lower coil segment;
    a magnetic core disposed between and insulated from the lower coil segment and the upper coil segment, wherein the magnetic core has a substantially rectangular cross-section and is formed in a second dielectric layer disposed over the first dielectric layer and under the upper coil segment, wherein an upper surface of the magnetic core is coplanar with an upper surface of the second dielectric layer, wherein the magnetic core has a thickness smaller than a thickness of the second dielectric layer, wherein the magnetic core comprises repeated layers of a film structure, and wherein the film structure comprises a first film comprising a first metal, a second film comprising the first metal, a third film comprising a second metal and a fourth film comprising an oxide of the second metal, with the third film and the fourth film being disposed between the first film and the second film;
    a third dielectric layer disposed over the magnetic core and the second dielectric layer and below the upper coil segment; and
    a plurality of vias disposed along opposing sidewalls of the magnetic core, wherein the vias extend through the second dielectric layer and the third dielectric layer to connect the upper coil segment with the lower coil segment.

17. The semiconductor device of claim 16, wherein the second dielectric layer comprises a material selected from the group consisting essentially of silicon nitride, silicon oxide, silicon oxynitride, silicon carbide, and combinations thereof.

18. The semiconductor device of claim 16, wherein the third dielectric layer comprises a material selected from the group consisting essentially of polybenzoxazole (PBO), polyimide, benzocyclobutene, and combinations thereof.

19. The method of claim 1, wherein the first metal is Ta, and the second metal is CoZrTa.

20. The method of claim 10, wherein the magnetic material comprises $Co_xZr_yTa_z$, wherein x is in a range from about 0.85 to about 0.95, y is in a range from about 0.025 to about 0.075, and z is in a range from about 0.025 to about 0.075.

* * * * *